United States Patent
Sperber et al.

(10) Patent No.: US 11,497,146 B2
(45) Date of Patent: Nov. 8, 2022

(54) POWER MODULE FOR OPERATING AN ELECTRIC VEHICLE DRIVE WITH IMPROVED THERMAL CONDUCTION FOR DRIVE ELECTRONICS

(71) Applicant: ZF Friedrichshafen AG, Friedrichshafen (DE)

(72) Inventors: Michael Sperber, Bayreuth (DE); Thomas Schupp, Bodnegg (DE); Christian Schanda, Ravensburg (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 0 days.

(21) Appl. No.: 17/348,092

(22) Filed: Jun. 15, 2021

(65) Prior Publication Data

US 2021/0392791 A1    Dec. 16, 2021

(30) Foreign Application Priority Data

Jun. 16, 2020    (DE) ..................... 10 2020 207 401.1

(51) Int. Cl.
*H05K 7/20*    (2006.01)
*H05K 1/02*    (2006.01)
*H01L 23/34*    (2006.01)

(52) U.S. Cl.
CPC ........... *H05K 7/209* (2013.01); *H05K 1/0218* (2013.01); *H05K 7/20509* (2013.01);
(Continued)

(58) Field of Classification Search
CPC ........ H02M 7/003; H02M 7/44; H02M 7/437; H02M 7/5387; H02M 7/539; H02M 7/53871; H02M 7/53875; B60L 3/003; B60L 11/1803; B60L 15/007; B60L 50/51; B60L 53/22; B60L 58/00; B60L 2210/40; H01L 23/12; H01L 23/367; H01L 23/34–3675; H01L 23/3736;
(Continued)

(56) References Cited

U.S. PATENT DOCUMENTS

2006/0055432 A1*    3/2006    Shimokawa ........... H01L 21/565
                                                      257/E23.125
2013/0003309 A1*    1/2013    Stella ................ H01L 23/49562
                                                      361/715
(Continued)

*Primary Examiner* — Zachary Pape
*Assistant Examiner* — Amir A Jalali
(74) *Attorney, Agent, or Firm* — Crowell & Moring LLP

(57) ABSTRACT

A power module for operating an electric vehicle drive, comprising power switches for generating an output current based on an input current; control electronics for controlling the power switches including a first region, to which a first electric potential is applied, and a second region, to which a second electric potential is applied, wherein the second electric potential is higher than the first electric potential; a heatsink for discharging heat generated by the power switches and the control electronics; a shielding layer for electrically shielding the control electronics placed between the heatsink and the control electronics, such that the control electronics lies on the shielding layer, and the shielding layer lies on the heatsink; wherein the shielding layer is designed to connect the heatsink thermally and electrically to the first region, and thermally to the second region, and electrically insulate it therefrom.

20 Claims, 2 Drawing Sheets

(52) U.S. Cl.
CPC .......... *H05K 7/20854* (2013.01); *H01L 23/34* (2013.01); *H05K 2201/10053* (2013.01); *H05K 2201/10409* (2013.01)

(58) Field of Classification Search
CPC ... H01L 23/49838; H01L 24/48; H01L 24/73; H01L 25/07; H01L 25/072; H01L 25/16; H01L 25/18; H01L 29/00; H01L 9/52; H01L 2224/32225; H01L 2224/48225; H01L 2224/73221; H01L 2224/37012; H01L 2224/40225; H01L 2924/13055; H01L 2924/3091; H01L 2924/10272; H05K 7/20; H05K 7/1432; H05K 7/20254; H05K 7/2039; H05K 7/209; H05K 7/20854; H05K 7/2089; H05K 1/0201; H05K 1/0203–0204; H05K 1/0218

See application file for complete search history.

(56) References Cited

U.S. PATENT DOCUMENTS

| | | | |
|---|---|---|---|
| 2013/0207256 A1* | 8/2013 | Uno | H01L 24/36 |
| | | | 438/106 |
| 2016/0336268 A1* | 11/2016 | Kamikura | H01L 23/49838 |
| 2018/0263111 A1* | 9/2018 | Sperber | H05K 1/0209 |
| 2018/0342932 A1* | 11/2018 | Wachter | H02K 9/22 |
| 2021/0351114 A1* | 11/2021 | Imanishi | H01L 23/3107 |

* cited by examiner

POWER MODULE FOR OPERATING AN ELECTRIC VEHICLE DRIVE WITH IMPROVED THERMAL CONDUCTION FOR DRIVE ELECTRONICS

CROSS-REFERENCE TO RELATED APPLICATIONS

This application claims the benefit of, and priority to, German Patent Application DE 10 2020 207 401.1, filed Jun. 16, 2020, which is incorporated by reference herein in its entirety.

TECHNICAL FIELD

The present invention relates to the field of electric mobility, in particular the power modules for operating an electric vehicle drive.

TECHNICAL BACKGROUND

Power modules, in particular integrated power modules, are increasingly used in motor vehicles. These power modules are used, e.g. in DC/AC inverters, which supply a multiphase alternating current to electric motors. A direct current generated by a DC power source, e.g. a battery, is converted for this into a multiphase alternating current. The power modules are based on power semiconductors, in particular transistors such as IGBTs, MOSFETs and HEMTs. Other uses are DC/DC converters and AC/DC converters and transformers.

Power switches used in a bridge circuit are normally formed by the power semiconductors. A common example is the so-called half-bridge, which comprises a high-side component and a low-side component. The high-side and low-side components each comprise one or more power switches, specifically high-side power switches and low-side power switches. Through targeted switching of the high-side and low-side power switches, the direction of the current (output current) generated at the output of the power module can be alternated in very short cycles between a positive current direction and a negative current direction. In the case of a DC/AC inverter this allows for a so-called pulse-width modulation for generating an alternating current based on a direct current supplied to the input of the power module.

In all of these applications it is advantageous when the switching time for the power switch that is used is short enough. Due to the progress made in the field of power semiconductors, short switching times can be obtained using so-called wide bandgap semiconductors (semiconductors with large bandgaps), such as SiC and GaN.

The targeted switching of the power switches is obtained using a control electronics. The control electronics comprises a printed circuit board populated with numerous electronic components that are primarily used to control gate electrodes in the power switch. With short switching times, or high activation frequencies, interference emissions from the power switches can be coupled into the control electronics that have a negative effect on the control behavior and impair the functionality of the power module.

Power modules are known from the prior art that use, e.g., a shield for shielding the control electronics from interference emissions. With these power modules, the thermal resistance between the control electronics, which generate heat when the power module is in operation that must be dissipated, and the heatsink is so high that the control electronics cannot be effectively cooled. A galvanic separation between the control electronics and the power switches is also insufficient.

The fundamental object of the invention is therefore to create a power module with improved heat conductance between the control electronics and the heatsink, while simultaneously ensuring an at least partial galvanic separation of the control electronics from the power switches.

This object is achieved by a power module and its use in a vehicle according to the independent claims.

The power module is used in the framework of this invention to operate an electric vehicle drive, in particular in an electric vehicle and/or a hybrid vehicle. The power module is preferably used in a DC/AC inverter. In particular, the power module is used to supply electric current to an electric machine, e.g. an electric motor, and/or a generator. A DC/AC inverter is used to generate a multiphase alternating current from a direct current generated by a DC voltage from an energy source, e.g. a battery.

For the input current (direct current) supply, the power module comprises a current input or input contact. The current input normally comprises numerous contact elements. A part of the contact elements, in particular a first half, are assigned to a positive pole in the current input, and another part of the contact elements, in particular a second half, are assigned to a negative pole in the current input. When the power module is in operation, the positive pole is electrically connected to a positive connection on the battery, and the negative pole is electrically connected to a negative connection on the battery.

The power module also contains numerous power switches. These semiconductor-based power switches are used for generating an output current based on the input current by activating the individual power switches. The power switches are controlled by a control electronics that contains a printed circuit board populated by numerous electronic components. The control thereof can be based on a so-called pulse-width modulation. With an inverter, the input current is a direct current and the output current is an alternating current. The control electronics is used for controlling the vehicle electrical system. For this, the control electronics has numerous regions where a first electrical potential (e.g. 12V) is applied. The control electronics is also used for controlling the vehicle drive. For this, the control electronics contains numerous second regions to which a second electrical potential (e.g. 400V or 800V) is applied, wherein the second electrical potential is higher than the first electrical potential. The various regions with different electrical potentials are galvanically separated from one another.

The numerous power switches preferably form a bridge circuitry, which can comprise one or more bridge circuits (i.e. half-bridges). Each bridge circuit or half-bridge comprises one or more high-side switches (HS switches) connected in parallel, and one or more low-side switches (LS switches) connected in parallel. The HS switch(es) are connected to the LS switch(es) in series. In the case of an inverter, each half-bridge is dedicated to one current phase in the multi-phase alternating current (output current). The HS switch and the LS switch each comprise one or more power semiconductor components, e.g. IGBT, MOSFET, HEMT. The fundamental semiconductor material for the respective power semiconductor component preferably comprises a so-called wide bandgap semiconductor (semiconductor with a wide bandgap), e.g. silicon carbide (SiC) or gallium nitride (GaN), and/or it can comprise silicon.

There is a heatsink for cooling the power switch and other electronic components in the power module that are thermally coupled to the power switches.

To electrically shield the control electronics, there is a shielding layer between the heatsink and the control electronics, which is placed such that the control electronics lie on the shielding layer. This shielding layer is designed such that the heatsink on which the shielding layer lies is thermally and electrically connected to the numerous first regions of the control electronics, and electrically insulated therefrom. The first regions are preferably low voltage regions used for controlling a vehicle electrical system. The second regions are preferably high voltage regions used for controlling a vehicle drive.

The conductive thermal coupling between the second regions (high voltage regions) in the control electronics, when these second (high voltage) regions are also galvanically separated from the heatsink, enables a thermal coupling that is more effective than convection-based thermal coupling known from prior power modules. The high voltage regions of the control electronics can therefore be cooled more effectively, such that heat losses are effectively discharged, and the functionalities of the control electronics and the power module are more protected against thermal damage.

The support structure can be formed by a magnetic, in particular ferromagnetic, material. Alternatively or additionally, the support structure can function as a retainer for the power switches.

Advantageous embodiments and developments are described in the dependent claims.

Embodiments shall be described by way of example and in reference to the attached drawings. Therein:

The same reference symbols are used for the same or functionally similar elements in the drawings.

Figure 1:
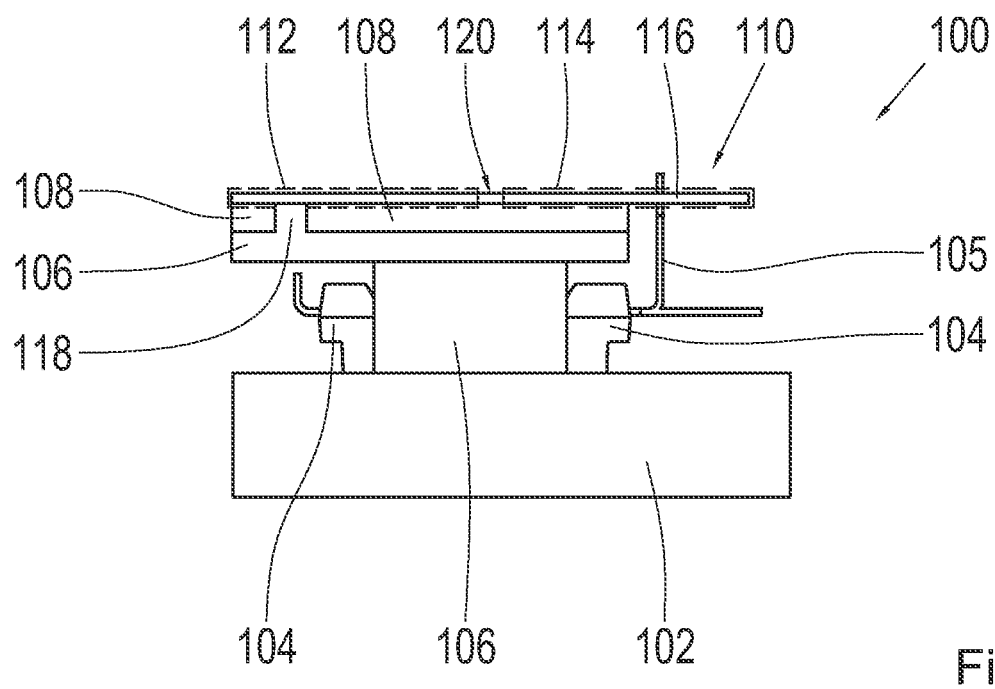
FIG. 1 shows a schematic illustration of a power module according to one embodiment.

FIG. 1 shows a schematic illustration of a power module 100 according to one embodiment. The power module 100 comprises a heatsink 102, a power switch assembly 104 comprising numerous power switches, which are not shown in detail in FIG. 1 for purposes of clarity, and control electronics 110 containing a printed circuit board 116 populated with electronic components, wherein these electronic components are not shown in detail for purposes of clarity. There is also a shielding layer placed between the control electronics 110 and the heatsink 102. The shielding layer is composed of a support structure 106 and an insulation layer 108 applied thereto. The support structure 106 is connected to the heatsink 102 from above in the drawing plane. The insulation layer 108 is placed on the support structure 106, wherein the printed circuit board 116 lies on the insulation layer 108. The insulation layer 108 forms an electrical insulation between these two surfaces of the control electronics 110 and the heatsink 102.

The control electronics 110 comprises a low voltage region 112 and a high voltage region. The low voltage region 112 is used for controlling a low potential electrical system, preferably the vehicle electrical system, with an operating voltage of 400V or 800V. The low voltage region 112 and the high voltage region 114 are galvanically separated from one another by a barrier 120, which comprises, e.g., a transformer.

The high voltage region 114 must be galvanically separated from the heatsink 102 when in operation, to prevent endangering living beings (e.g. humans) coming in contact with the heatsink 102. The insulation layer 108 is used for this. There must also be an electrical connection for conducting signals for controlling the power switches in the power switch assembly 104. A wire connection 105 is used for this, the first end of which is connected to the high voltage region 114, and the second end of which is connected to the power switch assembly 104.

The insulation layer 108 and the support structure 106 are each made of a thermally conductive material. When the insulation layer 108 and the support structure 106 are combined, they fulfill the function of a conductive thermal conductor between the high voltage region 114 and the heatsink 102.

The low voltage region 112 is connected thermally and electrically to the heatsink 102. The combined insulation layer 108 and support structure 106 likewise form the conductive thermal conductor, wherein the support structure 106 also has an additional low voltage region 112 and a raised area 118, which passes through a hole in the insulation layer 108 and comes in contact with the low voltage region 112 from below in the drawing plane, such that it is connected to the low voltage region 112. The raised area 118 also contributes to securing the insulation layer 108 in relation to the support structure 106. The support structure 106 is also made of an electrically conductive material, in order to establish the electrical connection between the low voltage region 112 and the heatsink 102.

Instead of the raised area 118, a screw connection can be used to secure the low voltage region 112 to the support structure 106, and provide an electrical connection to the support structure 106. The screw connection can also pass through the hole in the insulation layer 108 here as well. Alternatively or additionally, the hole/opening can also contain an electrically conductive material that is electrically connected to the support structure 106.

Figure 2:
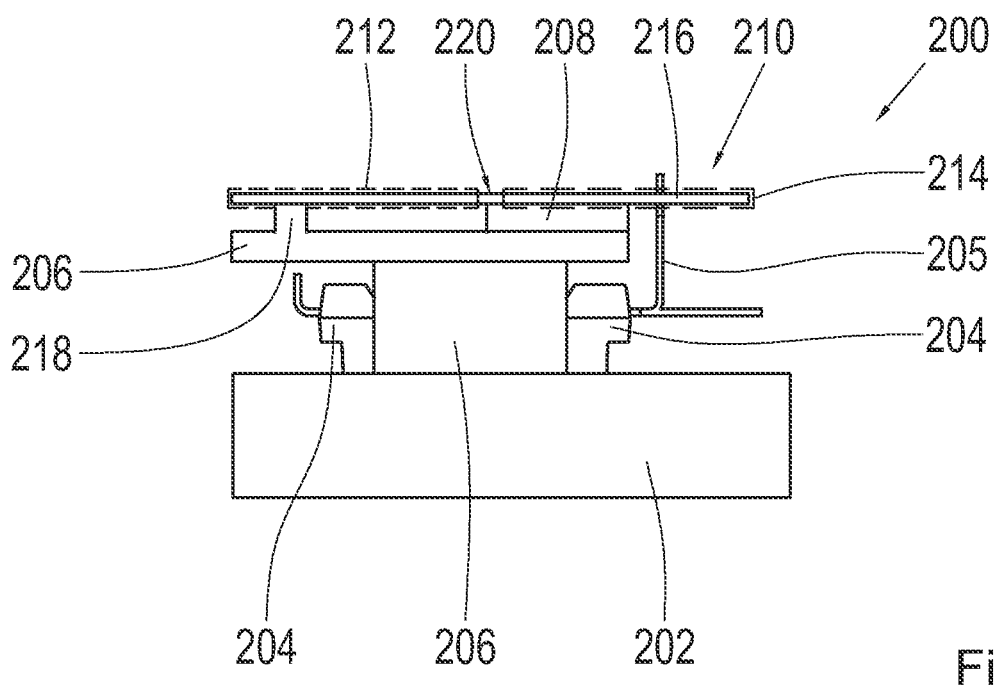
FIG. 2 shows a schematic illustration of a power module according to another embodiment.

FIG. 2 shows a schematic illustration of a power module 200 according to another embodiment. The power module 200 comprises, like the embodiment shown in FIG. 1, a heatsink 202, a power switch assembly 204, a shielding layer with a support structure 206, and an insulation layer 208, as well as control electronics 210 containing a printed circuit board 216 and numerous electronic components (not shown). The control electronics 210 herein also contain a low voltage region 212 and a high voltage region 214. The high voltage region 214 is separated from the support structure 206 by the insulation layer 208, which only extends underneath the high voltage region 214, unlike in the embodiment shown in FIG. 1, and is also electrically connected by a wire connection 205 to the power switch assembly 204, for conducting signals. A barrier 220 for a galvanic separation of the high voltage region 214 from the low voltage region 212 is placed between the high voltage region 214 and the low voltage region 212. The support structure 206 also has a raised area 218 here for establishing contact to the low voltage region 212. Alternatively or additionally, a screw connection can also be used for securing the low voltage region 212 to the support structure 206, in order to simultaneously provide an electrical connection to the support structure.

Figure 3:
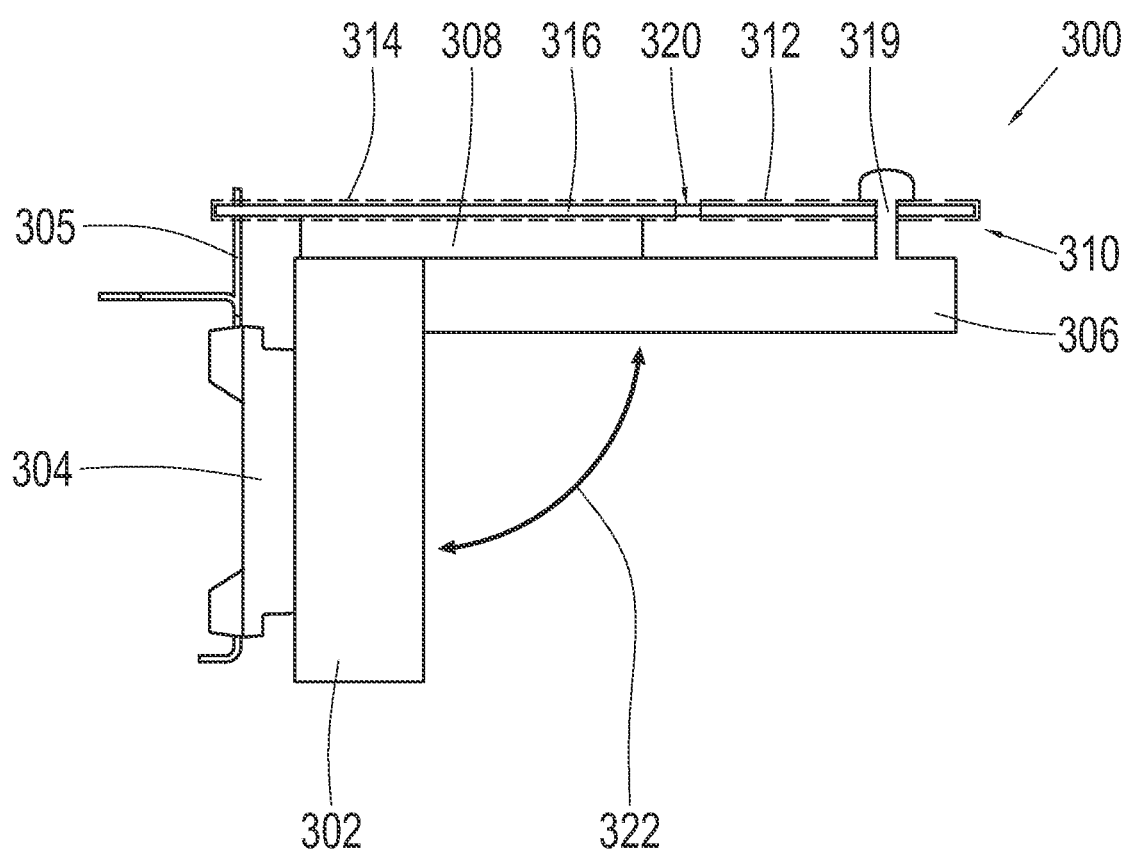
FIG. 3 shows a schematic illustration of a power module according to a third embodiment.

FIG. 3 shows a schematic illustration of a power module 300 according to a third embodiment. The power module 300 comprises, like the embodiments shown in FIGS. 1 and 2, a heatsink 302, a power switch assembly 304, a shielding layer with a support structure 306, and an insulation layer 308, as well as control electronics 310 containing a printed circuit board 316 and numerous electronic components (not shown). The control electronics 310 also has a low voltage region 312 and a high voltage region 314 here. The high voltage region 314 is separated from the support structure 306 by the insulation layer 308, which only extends underneath the high voltage area 314, like that in the embodiment shown in FIG. 2, while at the same time being electrically connected to the power switch assembly 304 by a wire connection 305 for conducting signals. A barrier 320 is located between the high voltage region 314 and the low voltage region 312 for galvanic separation of the high voltage region 314 from the low voltage region 312. A screw connection 319 is used to secure the low voltage region 312 to the support structure 306, and extends through a hole provided in the printed circuit board 316 in the control electronics 310 for this, in order to simultaneously form an electrical connection to the support structure 306.

In differing from the embodiments shown in FIGS. 1 and 2, the heatsink 302 in the embodiment shown in FIG. 3 is placed such that a longitudinal plane of the heatsink 302 forms an angle 322, in particular a right angle, to a plane along which the support structure 306 extends. The insulation layer 308 is also located in part between the high voltage region 314 and the heatsink 302, wherein the insulation layer 308 lies on the heatsink 302.

In all of the embodiments shown above, the high voltage region 114, 214, 314 in the control electronics 110 210, 310 is electrically insulated from the heatsink 102, 202, 302 by the insulation layer 108, 208, 308, and simultaneously connected in a thermally conductive manner to the heatsink 102, 202, 302. The low voltage region 112, 212, 312 in the control electronics 110, 210, 310 is electrically connected to the heatsink 102, 202, 302 by means of the raised area 118, 218, or the screw connection 319. A conductive thermal conductor between the low voltage region 112 and the heatsink 102 is obtained by means of the insulation layer 108 in the embodiment shown in FIG. 1. In the two other embodiments, a convection-based thermal coupling is established between the low voltage region 212, 312 and the heat sink 202, 302 by means of the raised area 218 or the screw connection 319.

REFERENCE SYMBOLS 100, 200, 300 power module
102, 202, 302 heatsink
104, 204, 304 power switch assembly
105, 205, 305 wire connection
106, 206, 306 support structure
108, 208, 308 insulation layer
110, 210, 310 control electronics
112, 212, 312 low voltage region
114, 214, 314 high voltage region
116, 216, 316 printed circuit board
118, 218 raised area
319 screw connection
120, 220, 320 barrier
322 angle

The invention claimed is:

1. A power module for operating an electric vehicle drive, comprising:
a plurality of power switches for generating an output current based on a input current;
control electronics configured to control the plurality of power switches, wherein the control electronics comprises a first region to which a first electric potential is applied, wherein the control electronics comprises a second region to which a second electric potential is applied, wherein the second electric potential is higher than the first electric potential;
a heatsink configured to discharge heat generated by the plurality of power switches and the control electronics; and
a shielding layer configured to electrically shield the control electronics, wherein the shielding layer is placed between the heatsink and the control electronics, such that the control electronics lies on the shielding layer and the shielding layer lies on the heatsink;
wherein the shielding layer connects the heatsink thermally and electrically to the first region, and
wherein the shielding layer connects the heatsink thermally to the second region, and electrically insulates the heatsink from the second region.

2. The power module according to claim 1, wherein the shielding layer comprises a support structure and an insulation layer applied to the support structure.

3. The power module according to claim 2, wherein the support structure is attached to the first region of the control electronics by means of at least one of a form-fitting connection, a material bonded connection, or a screw connection.

4. The power module according to claim 3, wherein the insulation layer has a hole through which at least one of the raised area on the support structure, the form-fitting connection, the material bonded connection, or the screw connection passes.

5. The power module according to claim 2, wherein the insulation layer has a hole containing an electrically conductive material, wherein the electrically conductive material is electrically connected to the support structure.

6. The power module according to claim 2, wherein the insulation layer is connected to at least one of the first region or the second region at a side facing away from the support structure.

7. The power module according to claim 2, wherein the support structure is made of a magnetic material.

8. The power module according to claim 2, wherein the support structure is made of a thermally conductive and electrically conductive substance.

9. The power module according to claim 2, wherein the support structure functions as a retainer for the power switches.

10. The power module according to claim 2, wherein the control electronics contains a printed circuit board that is populated on one side with electronic components.

11. The power module according to claim 2, wherein a plane along which the support structure forms an angle with the longitudinal plane of the heatsink.

12. The power module according to claim 2, wherein the support structure contains a raised area, which comes in contact with the first region in the control electronics on a side facing the heatsink.

13. The power module according to claim 12, wherein the support structure is attached to the first region of the control electronics by means of at least one of a form-fitting connection, a material bonded connection, or a screw connection.

14. The power module according to claim 13, wherein the insulation layer has a hole through which at least one of the raised area on the support structure, the form-fitting connection, the material bonded connection, or the screw connection passes.

15. The power module according to claim 12, wherein the insulation layer has a hole containing an electrically conductive material, wherein the electrically conductive material is electrically connected to the support structure.

16. The power module according to claim 12, wherein the insulation layer is connected to at least one of the first region or the second region at a side facing away from the support structure.

17. The power module according to claim 12, wherein the support structure is made of a magnetic material.

18. The power module according to claim 12, wherein the support structure is made of a thermally conductive and electrically conductive substance.

19. The power module according to claim 12, wherein the support structure functions as a retainer for the power switches.

20. The power module according to claim 12, wherein a plane along which the support structure forms an angle with the longitudinal plane of the heatsink.

\* \* \* \* \*